United States Patent
Inoue et al.

(10) Patent No.: US 11,078,120 B2
(45) Date of Patent: Aug. 3, 2021

(54) OXIDE SINTERED BODY, SPUTTERING TARGET AND OXIDE SEMICONDUCTOR FILM

(71) Applicant: IDEMITSU KOSAN CO., LTD., Tokyo (JP)

(72) Inventors: Kazuyoshi Inoue, Sodegaura (JP); Futoshi Utsuno, Sodegaura (JP); Shigekazu Tomai, Sodegaura (JP); Masatoshi Shibata, Sodegaura (JP); Mami Itose, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 244 days.

(21) Appl. No.: 16/096,641

(22) PCT Filed: Apr. 26, 2017

(86) PCT No.: PCT/JP2017/016493
§ 371 (c)(1),
(2) Date: Oct. 25, 2018

(87) PCT Pub. No.: WO2017/188299
PCT Pub. Date: Nov. 2, 2017

(65) Prior Publication Data
US 2020/0325072 A1  Oct. 15, 2020

(30) Foreign Application Priority Data

Apr. 26, 2016 (JP) ............... JP2016-088123
Dec. 26, 2016 (JP) ............... JP2016-251809

(51) Int. Cl.
H01L 21/02 (2006.01)
C04B 35/01 (2006.01)
(Continued)

(52) U.S. Cl.
CPC .......... *C04B 35/01* (2013.01); *C04B 35/6261* (2013.01); *C04B 35/64* (2013.01);
(Continued)

(58) Field of Classification Search
CPC .................. C04B 35/01; H01L 29/242
(Continued)

(56) References Cited

U.S. PATENT DOCUMENTS 6,534,183 B1    3/2003 Inoue
6,689,477 B2    2/2004 Inoue
(Continued)

FOREIGN PATENT DOCUMENTS

CN        1699262 A    11/2005
CN      101350313 A     1/2009
(Continued)

OTHER PUBLICATIONS

Office Action dated Jul. 23, 2020 for corresponding Taiwanese Patent Application No. 106113998.
(Continued)

*Primary Examiner* — Khanh T Nguyen
(74) *Attorney, Agent, or Firm* — Foley & Lardner LLP

(57) ABSTRACT

An oxide sintered body is characterized in that it comprises an oxide including an In element, a Zn element, a Sn element and a Y element and that a sintered body density is equal to or more than 100.00% of a theoretical density.

15 Claims, 3 Drawing Sheets

(51) Int. Cl.
  *C04B 35/626* (2006.01)
  *C04B 35/64* (2006.01)
  *C23C 14/08* (2006.01)
  *C23C 14/34* (2006.01)
  *H01L 27/12* (2006.01)
  *H01L 29/24* (2006.01)
  *H01L 29/786* (2006.01)

(52) U.S. Cl.
  CPC .......... *C23C 14/083* (2013.01); *C23C 14/086* (2013.01); *C23C 14/3407* (2013.01); *H01L 21/02565* (2013.01); *H01L 21/02592* (2013.01); *H01L 21/02631* (2013.01); *H01L 27/127* (2013.01); *H01L 27/1225* (2013.01); *H01L 29/247* (2013.01); *H01L 29/78693* (2013.01); *C04B 2235/3284* (2013.01); *C04B 2235/3286* (2013.01); *C04B 2235/3293* (2013.01); *C04B 2235/604* (2013.01); *C04B 2235/6562* (2013.01); *C04B 2235/6567* (2013.01)

(58) Field of Classification Search
  USPC .................................................. 252/519.15
  See application file for complete search history.

(56) References Cited

U.S. PATENT DOCUMENTS

| | | |
|---|---|---|
| 8,017,513 B2 | 9/2011 | Jeong et al. |
| 8,154,017 B2 | 4/2012 | Yabuta et al. |
| 8,502,222 B2 | 8/2013 | Yabuta et al. |
| 8,796,679 B2 | 8/2014 | Jeong et al. |
| 2003/0148871 A1 | 8/2003 | Inoue |
| 2009/0020753 A1 | 1/2009 | Jeong et al. |
| 2010/0044703 A1 | 2/2010 | Yabuta et al. |
| 2011/0315983 A1 | 12/2011 | Jeong et al. |
| 2011/0317241 A1 | 12/2011 | Cammenga et al. |
| 2012/0146021 A1 | 6/2012 | Yabuta et al. |
| 2014/0103268 A1 | 4/2014 | Itose et al. |
| 2020/0325072 A1 | 10/2020 | Inoue et al. |

FOREIGN PATENT DOCUMENTS

| | | | |
|---|---|---|---|
| CN | 101669208 A | 3/2010 | |
| JP | 08-269702 | 10/1996 | |
| JP | 09-209134 | 8/1997 | |
| JP | 10-110265 | 4/1998 | |
| JP | 2000-169219 A | 6/2000 | |
| JP | 2012-031508 A | 2/2012 | |
| JP | 2013-082998 A | 5/2013 | |
| JP | 2014-099493 A | 5/2014 | |
| JP | 2014-111818 A | 6/2014 | |
| JP | 2015-214436 A | 12/2015 | |
| TW | 2010-24435 A | * 7/2010 | ............. C04B 35/01 |
| TW | 201434788 A | 9/2014 | |
| TW | 201806908 A | 3/2018 | |
| WO | WO-2010/032432 A1 | 3/2010 | |
| WO | WO-2012/153507 A1 | 11/2012 | |
| WO | WO-2014/073210 A1 | 5/2014 | |

OTHER PUBLICATIONS

International Search Report dated Jul. 11, 2017 in corresponding application No. PCT/JP2017/016493.
Translation of the Written Opinion of the International Searching Authority dated Nov. 8, 2018 in corresponding application No. PCT/JP2017/016493.
Office Action dated Feb. 3, 2021 for corresponding Chinese Patent Application No. 201780025317.2
Office Action dated Mar. 16, 2021 for corresponding Taiwanese Patent Application No. 109136887.

* cited by examiner

OXIDE SINTERED BODY, SPUTTERING TARGET AND OXIDE SEMICONDUCTOR FILM

CROSS-REFERENCE TO RELATED APPLICATIONS

The present application is a U.S. national stage application claiming the benefit of International Patent Application No. PCT/JP2017/016493, filed Apr. 26, 2017, which claims the benefit of priority to Japanese Patent Application No. 2016-088123, filed Apr. 26, 2016, and Japanese Patent Application No. 2016-251809, filed Dec. 26, 2016, the disclosures of which are hereby incorporated by reference.

TECHNICAL FIELD

The present invention relates to a thin-film transistor (TFT) used for a display device and the like, such as a liquid crystal display (LCD) and an organic electroluminescent (EL) display, an oxide semiconductor film which can be used for the TFT, a sputtering target which can be used to manufacture the oxide semiconductor film and the like, and an oxide sintered body being a material thereof.

BACKGROUND ART

Compared with a general-purpose amorphous silicon (a-Si), an amorphous oxide semiconductor used for a thin-film transistor has a higher carrier mobility and a lager optical bandgap and can be film-formed at a lower temperature. Thus, its application to a next-generation display, which is required to be large, have high resolution and be driven at a high speed, and to a resin substrate and the like having a low heat resistance has been expected.

To form the above oxide semiconductor (film), a sputtering method of sputtering a sputtering target is preferably used. This is because a thin film formed by the sputtering method is superior to a thin film formed by an ion plating method, a vacuum deposition method or an electron beam deposition method in terms of in-plane uniformity of the composition, the film thickness and the like, in a film surface direction (in the film surface), and a thin film having the same composition as that of the sputtering target can be formed.

Patent Document 1 describes that an oxide sintered body, which is made of In, Y and O, Y/(Y+In) of which is 2.0 to 40 at %, and which has a volume resistivity of $5 \times 10^{-2}$ Ωcm or less, is used as a target. Regarding the content of Sn element, Patent Document 1 also describes that Sn/(In+Sn+ all of the other metallic atoms) is 2.8 to 20 at %.

Patent Document 2 describes an oxide sintered body which is made of In, Sn, Y and O and Y/(In+Sn+Y) of which is 0.1 to 2.0 at %, and a sputtering target including this oxide sintered body. Patent Document 2 also describes that a thin film obtained from this target constitutes a device such as a flat panel display and a touch panel.

Patent Document 3 describes a sintered body having a lattice constant intermediate between those of $YInO_3$ and $In_2O_3$ and use thereof as a sputtering target. Patent Document 3 also describes a sintered body made of indium oxide, yttrium oxide and tin oxide and including $In_2O_3$ and $Y_2SnO_7$ compounds. Moreover, Patent Document 3 describes a sintered body made of yttrium oxide, tin oxide and zinc oxide and including $Y_2Sn_2O_7$ and ZnO or $Zn_2SnO_4$ compounds. This sintered body, which is sintered by using an atmosphere furnace under a specific condition of an oxygen atmosphere, has a low volume resistivity and a high density, but is brittle and can be cracked or chipped during manufacture of a sputtering. Thus, there has been a case in which a manufacturing yield does not rise. Moreover, because of its low strength, there has been a case in which the sintered body is cracked at the time of sputtering with large power.

Patent Document 4 describes an oxide sintered body including In, Sn, Zn and at least one element selected from a group consisting of Mg, Si, Al, Sc, Ti, Y, Zr, Hf, Ta, La, Nd and Sm, and use thereof as a sputtering target. This sintered body includes $In_2O_3$ and $Zn_2SnO_4$ compounds.

Patent Document 5 describes a sputtering target to which In, Sn, Zn and an element selected from Mg, Al, Ga, Si, Ti, Y, Zr, Hf, Ta, La, Nd and Sm are added and which includes a bixbyite structure compound and a spinel structure compound.

Patent Document 6 describes a sintered body to which In, Sn, Zn and an element selected from Hf, Zr, Ti, Y, Nb, Ta, W, Mo and Sm are added and which includes one or more layers selected from an $In_2O_3$ phase, a spinel phase, a $X_2Sn_2O_7$ phase (pyrochlore phase) and $ZnX_2O_6$.

On the other hand, a higher-performance TFT has been strongly demanded, and a material has been greatly desired, which has a high mobility and a small characteristic change caused by, for example, heating when a protective film or an insulating film is formed by chemical vapor deposition (CVD).

PRIOR ART DOCUMENTS

Patent Documents

Patent Document 1: Japanese Unexamined Patent Application Publication No. 09-209134
Patent Document 2: Japanese Unexamined Patent Application Publication No. 2000-169219
Patent Document 3: WO 2010/032432
Patent Document 4: WO 2012/153507
Patent Document 5: Japanese Unexamined Patent Application Publication No. 2014-111818
Patent Document 6: Japanese Unexamined Patent Application Publication No. 2015-214436

SUMMARY OF THE INVENTION

Addition of an element having a large atomic radius such as yttrium to an indium oxide-based target material changes the lattice constant of the indium oxide, which can reduce the strength of the target material as the sintered density does not increase, generate microcracks due to thermal stress during sputtering with large power, and generate abnormal electrical discharges due to chipping. These phenomena produce defects and deteriorate TFT performance.

An object of the present invention is to provide a TFT showing superior TFT performance, an oxide semiconductor film which can be used for the TFT, a sputtering target through the use of which the oxide semiconductor film can be formed, and an oxide sintered body being a material thereof.

The present invention provides the following oxide sintered body:

1. An oxide sintered body comprising an oxide including an In element, a Zn element, a Sn element and a Y element, wherein
  a sintered body density is equal to or more than 100.00% of a theoretical density.

2. The oxide sintered body according to 1, wherein the oxide sintered body includes a bixbyite phase represented by $In_2O_3$ and a pyrochlore phase represented by $Y_2Sn_2O_7$.
3. The oxide sintered body according to 2, wherein any one or more of the Y element and the Zn element form a substitutional solid solution with the bixbyite phase.
4. The oxide sintered body according to any one of 1 to 3, wherein atomic ratios of the Zn element, the Y element, the Sn element and the In element are within the following ranges:

$0.01 \leq Zn/(In+Zn+Y+Sn) \leq 0.25$, $0.03 \leq Y/(In+Zn+Y+Sn) \leq 0.25$, $0.03 \leq Sn/(In+Zn+Y+Sn) \leq 0.30$, and $0.20 \leq In/(In+Zn+Y+Sn) \leq 0.93$.

5. An oxide sintered body comprising an In element, a Zn element, a Sn element and a Y element, wherein
atomic ratios of the Zn element and the In element are within ranges below, and
the sintered oxide body includes no spinel phase represented by $Zn_2SnO_4$.

$0.01 \leq Zn/(In+Zn+Y+Sn) \leq 0.25$ $0.50 \leq In/(In+Zn+Y+Sn)$

6. The oxide sintered body according to 5, wherein the oxide sintered body includes a bixbyite phase represented by $In_2O_3$ and a pyrochlore phase represented by $Y_2Sn_2O_7$.
7. The oxide sintered body according to 6, wherein any one or more of the Y element and the Zn element form a substitutional solid solution with the bixbyite phase.
8. The oxide sintered body according to any one of 5 to 7, wherein atomic ratios of the Y element and the Sn element are within the following ranges:

$0.03 \leq Y/(In+Zn+Y+Sn) \leq 0.25$, and $0.03 \leq Sn/(In+Zn+Y+Sn) \leq 0.30$.

9. An oxide sintered body comprising an In element, a Zn element, a Sn element and a Y element, wherein
atomic ratios of the Zn element and the In element are within ranges below, wherein
the oxide sintered body consists of a bixbyite phase represented by $In_2O_3$ and a pyrochlore phase represented by $Y_2Sn_2O_7$, or
the oxide sintered body consists of a bixbyite phase represented by $In_2O_3$, a pyrochlore phase represented by $Y_2Sn_2O_7$ and an indium trizincoindate phase represented by $In((Zn_3In)O_6)$.

$0.01 \leq Zn/(In+Zn+Y+Sn) \leq 0.25$ $0.50 \leq In/(In+Zn+Y+Sn)$

10. The oxide sintered body according to 9, wherein any one or more of the Y element and the Zn element form a substitutional solid solution with the bixbyite phase.
11. The oxide sintered body according to 9 or 10, wherein atomic ratios of the Y element and the Sn element are within the following ranges:

$0.03 \leq Y/(In+Zn+Y+Sn) \leq 0.25$, and $0.03 \leq Sn/(In+Zn+Y+Sn) \leq 0.30$.

12. A sputtering target comprising the oxide sintered body according to any one of 1 to 11.

13. An oxide semiconductor film, wherein
atomic ratios of a Zn element, a Y element, a Sn element and an In element are within the following ranges:

$0.01 \leq Zn/(In+Zn+Y+Sn) \leq 0.25$, $0.03 \leq Y/(In+Zn+Y+Sn) \leq 0.25$, $0.03 \leq Sn/(In+Zn+Y+Sn) \leq 0.30$, and $0.20 \leq In/(In+Zn+Y+Sn) \leq 0.93$.

14. The oxide semiconductor film according to 13, wherein the oxide semiconductor film is amorphous.
15. A thin-film transistor comprising the oxide semiconductor film according to 13 or 14.

The present invention can provide a TFT showing superior TFT performance, an oxide semiconductor film which can be used for the TFT, a sputtering target through the use of which the oxide semiconductor film can be formed, and an oxide sintered body being a material thereof.

EMBODIMENTS FOR CARRYING OUT THE INVENTION

Figure 1:
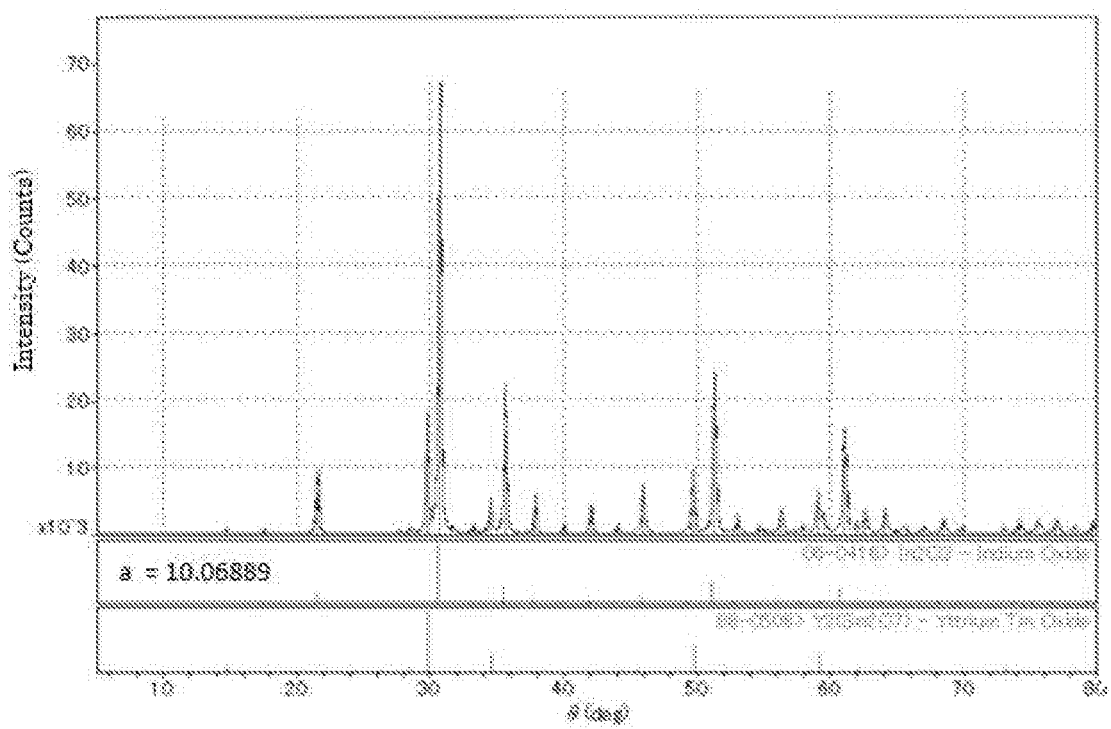
FIG. 1 shows an X-ray diffraction pattern of an oxide sintered body produced in Example 1.

Hereinafter, the term "A to B" regarding the descriptions of numerical values means "equal to or more than A and equal to or less than B" in the present specification.

An oxide sintered body according to a first embodiment of the present invention includes an oxide including an In element, a Zn element, a Sn element and a Y element, and the sintered body density is equal to or more than 100.00% of the theoretical density.

The oxide sintered body according to the first embodiment of the present invention, an oxide sintered body according to a second embodiment of the present invention described below and an oxide sintered body according to a third embodiment of the present invention described below are collectively referred to as an oxide sintered body of the present invention.

Here, the feature "the sintered body density is equal to or more than 10.00% of the theoretical density" means that a value obtained by dividing the density of the oxide sintered body actually measured by an Archimedes method by the theoretical density of the oxide sintered body is equal to or more than 100.00% when expressed as a percentage. In the present invention, the theoretical density is calculated as follows:

The theoretical density=the total weight of raw powder used for the oxide sintered body/the total volume of the raw powder used for the oxide sintered body.

For example, when an oxide A, an oxide B, an oxide C and an oxide D are used as the raw powder of the oxide sintered body, and the used amount (loaded amount) of the oxide A, the oxide B, the oxide C and the oxide D are a(g), b(g), c(g) and d(g), respectively, the theoretical density can be calculated by applying these values in the following manner:

The theoretical density=$(a+b+c+d)/((a/$the density of the oxide $A)+(b/$the density of the oxide $B)+(c/$the density of the oxide $C)+(d/$the density of the oxide $D))$.

In addition, regarding the density of each oxide, since the density and the specific gravity are almost the same, the relative gravity values of the oxides described in Kagaku Binran, Kiso Hen I, the revised second edition, edited by the Chemical Society of Japan (Maruzen Publishing Co., Ltd.) are used.

The sintered body density of the oxide sintered body according to the first embodiment of the present invention is equal to or more than 100.00% of the theoretical density, which means that there are few gaps which can cause abnormal electrical discharges or which can become points where nodules are started to be generated, thereby allowing stable sputtering in which few cracks are generated.

The sintered body density is preferably equal to or more than 100.01% of the theoretical density, more preferably equal to or more than 100.1%. Although the upper limit is not particularly determined, the sintered body density is preferably equal to or less than 105%. When the sintered body density is more than 105%, a metallic component can be included, and thus there is a case in which it takes time to make sputtering conditions for forming a semiconductor and annealing conditions appropriate or conditions must be determined for each target to form a semiconductor film.

The oxide sintered body according to the first embodiment of the present invention preferably includes a bixbyite phase represented by $In_2O_3$ and a pyrochlore phase represented by $Y_2Sn_2O_7$. By including the bixbyite phase represented by $In_2O_3$ and the pyrochlore phase represented by $Y_2Sn_2O_7$ in the oxide sintered body, the zinc element forms a solid solution with the bixbyite phase represented by $In_2O_3$ and/or with the pyrochlore phase represented by $Y_2Sn_2O_7$, which allows the oxide sintered body to have a high density.

Inclusion of the bixbyite phase represented by $In_2O_3$ and the pyrochlore phase represented by $Y_2Sn_2O_7$ in the oxide sintered body can be confirmed by examining the crystal structure by means of an X-ray diffraction measuring device (XRD).

The oxide sintered body according to the first embodiment of the present invention may include an indium trizincoindate represented by $In((Zn_3In)O_6)$ within the bounds of not impairing the effect of the present invention.

The crystalline phase of the oxide sintered body according to the first embodiment of the present invention may include only the bixbyite phase represented by $In_2O_3$, the pyrochlore phase represented by $Y_2Sn_2O_7$ and the indium trizincoindate phase represented by given $In((Zn_3In)O_6)$.

Moreover, regarding a sintered body including an indium oxide and a zinc oxide, a bixbyite compound made of the indium oxide and a hexagonal layered compound represented by $In_2O_3(ZnO)_m$ (m is an integer of 1 to 20) are typically formed. This means that the zinc element reacts with the indium oxide without forming a solid solution with the indium oxide. Even when an yttrium oxide is added to this composition, a hexagonal layered compound represented by $In_2O_3(ZnO)_2$ and/or an indium oxide in which an yttrium element forms a solid solution are formed.

Regarding a sintered body including an indium oxide, a zinc oxide and a tin oxide, a bixbyite compound made of the indium oxide, a hexagonal layered compound represented by $In_2O_3(ZnO)_m$ (m is an integer of 1 to 20) and a spinel compound represented by $Zn_2SnO_4$ can be typically formed.

Regarding a sintered body including an indium oxide, an yttrium oxide and a tin oxide, it is known that a bixbyite compound represented by $In_2O_3$ and a pyrochlore compound represented by $Y_2Sn_2O_7$ are formed.

When the oxide sintered body of the present invention includes the bixbyite phase represented by $In_2O_3$, the proportion of presence of the bixbyite phase represented by $In_2O_3$ in the oxide sintered body is preferably 50 to 99 wt % and more preferably 60 to 98 wt %.

When the proportion of presence of the bixbyite phase represented by $In_2O_3$ is within the above range, the pyrochlore phase or the indium trizincoindate phase is dispersed in the sintered body mainly composed of the bixbyite phase represented by $In_2O_3$, and, by doping it with a rare-earth element, it may also be possible to apply the oxide sintered body to a fluorescent material and the like other than a target material.

Preferably, the oxide sintered body of the present invention is mainly composed of the bixbyite phase represented by $In_2O_3$. This reduces the bulk resistance of the sintered body and allows the oxide sintered body to be preferably used for a sputtering target. Moreover, this facilitates improvement of the mobility of a semiconductor thin film obtained from this sputtering target.

The feature "mainly composed of the bixbyite phase represented by $In_2O_3$" means that the proportion of presence of the bixbyite phase represented by $In_2O_3$ in the oxide sintered body is equal to or more than 50 wt %, preferably equal to or more than 60 wt %, more preferably equal to or more than 70 wt % and further more preferably equal to or more than 80 wt %.

When the oxide sintered body of the present invention includes the bixbyite phase represented by $In_2O_3$, any one or more of the Y element and the Zn element preferably form a substitutional solid solution with this bixbyite phase. This facilitates improvement of the density of the sintered body.

The zinc element forming the substitutional solid solution with the bixbyite phase represented by $In_2O_3$ can be confirmed from the lattice constant of the bixbyite structure of the indium oxide in the sintered body smaller than the lattice constant of the indium oxide alone. Moreover, the yttrium element forming the substitutional solid solution with the bixbyite phase represented by $In_2O_3$ can be confirmed from the lattice constant of the bixbyite structure of the indium oxide in the sintered body larger than the lattice constant of the indium oxide alone.

The zinc element and the yttrium element forming the substitutional solid solutions can be adjusted by the additive amount of the yttrium oxide used to manufacture the sintered body. By adding a small amount of the yttrium oxide, the indium oxide having the bixbyite structure in which the zinc element has formed the substitutional solid solution can be produced. By adding a large amount of the yttrium oxide, the indium oxide having the bixbyite structure in which the yttrium element has formed the substitutional solid solution can be produced.

Here, the "lattice constant" is defined as the length of the lattice axis of a unit lattice and can be determined by an X-ray diffraction method. The lattice constant of the bixbyite structure of the indium oxide is 10.118 Å.

In the case of a thin-film transistor, the overlap of orbits becomes larger as the distance between atoms is shorter, which is considered to facilitate obtainment of a high-mobility transistor. Thus, it is considered that the lattice constant of a bixbyite structure of an indium oxide smaller than a common lattice constant of 10.118 Å facilitates manufacture of a high-performance thin-film transistor.

The atomic ratios of Zn, Y, Sn and In of the oxide sintered body according to the first embodiment of the present invention is preferably as follows:

The atomic ratio represented by Zn/(In+Zn+Y+Sn) is preferably 0.01 to 0.25 and more preferably 0.03 to 0.25.

The atomic ratio represented by Y/(In+Zn+Y+Sn) is preferably 0.03 to 0.25 and more preferably 0.05 to 0.20.

The atomic ratio represented by Sn/(In+Zn+Y+Sn) is preferably 0.03 to 0.30 and more preferably 0.05 to 0.30.

The atomic ratio represented by In/(In+Zn+Y+Sn) is preferably 0.20 to 0.93 and more preferably 0.25 to 0.87.

Raw materials are used to manufacture the sintered body such that the above composition is satisfied, so that the oxide sintered body according to the first embodiment of the present invention can be obtained.

The atomic ratio represented by Zn/(In+Zn+Y+Sn) is preferably 0.01 to 0.25. When the atomic ratio is less than 0.01, the effect of densification by the zinc element cannot be achieved, so that only a low-density sintered body can be obtained. When the atomic ratio is more than 0.25, the zinc element cannot form a solid solution with the indium oxide or with the pyrochlore compound represented by $Y_2Sn_2O_7$ and can be precipitated as a zinc oxide, and a hexagonal layered compound such as $In_2O_3(ZnO)_2$ can be formed. Moreover, when the atomic ratio is more than 0.25, and a semiconductor layer of a thin-film transistor (TFT) is formed by using a sputtering target manufactured from the sintered body, only a TFT lacking in stability can be obtained.

The atomic ratio represented by Zn/(In+Zn+Y+Sn) is preferably 0.03 to 0.25, more preferably 0.05 to 0.22 and further more preferably 0.08 to 0.20.

The atomic ratio represented by Y/(In+Zn+Y+Sn) is preferably 0.03 to 0.25. When the atomic ratio is less than 0.03, and a semiconductor layer of a thin-film transistor (TFT) is formed by using a sputtering target manufactured from the sintered body, the layer cannot be turned into a semiconductor and can be an electric conductor, so that only a TFT lacking in stability can be obtained. Moreover, when the atomic ratio is more than 0.25, and a semiconductor layer of a thin-film transistor (TFT) is formed by using a sputtering target manufactured from the sintered body, the layer cannot be turned into a semiconductor and can be turned into an insulator.

The atomic ratio represented by Y/(In+Zn+Y+Sn) is preferably 0.05 to 0.22, more preferably 0.05 to 0.20 and further more preferably 0.07 to 0.20.

The atomic ratio represented by Sn/(In+Zn+Y+Sn) is preferably 0.03 to 0.30. When the atomic ratio is less than 0.03, the resistance value of a target cannot decrease, the strength of the sintered body subsequently cannot increase as the sintered density does not increase, and an adverse effect can be exerted on the coefficient of linear expansion or the thermal conductivity. Moreover, when a semiconductor layer of a thin-film transistor (TFT) is formed by using a sputtering target manufactured from the sintered body having an atomic ratio of less than 0.03, the layer can be dissolved in mixed acid made of phosphoric acid, nitric acid and acetic acid being etching liquid of a wiring metal, so that a back channel TFT, which is a structure of a TFT, cannot be formed. In contrast, when the atomic ratio is more than 0.30, the density of the sintered body can be easily improved. Moreover, when a semiconductor layer of a thin-film transistor (TFT) is formed by using a sputtering target manufactured from the sintered body, the layer cannot be etched by organic acid such as oxalic acid, so that a TFT cannot be formed.

The atomic ratio represented by Sn/(In+Zn+Y+Sn) is preferably 0.05 to 0.30, more preferably 0.08 to 0.28 and further more preferably 0.10 to 0.25.

The atomic ratio represented by In/(In+Zn+Y+Sn) is preferably 0.20 to 0.93.

When the composition ratio of the indium element in the sintered body is high, a TFT having a high mobility, which is a TFT characteristic, can be obtained. Thus, the composition ratio is preferably high. However, its amount is determined from the additive amount of each additive element taking desired TFT characteristics into account.

The atomic ratio represented by In/(In+Zn+Y+Sn) is preferably 0.25 to 0.87.

The content (the atomic ratio) of each metallic element in the oxide sintered body of the present invention can be determined by measuring the amount of presence of each element by for example an ICP (Inductively Coupled Plasma) measurement.

The oxide sintered body of the present invention includes an indium element, a zinc element, a tin element and an yttrium element, and the metallic elements included in the oxide sintered body of the present invention may substantially include an indium element, a zinc element, a tin element and an yttrium element.

In the present invention, the term "substantially" means that the content ratios of the indium element, the zinc element, the tin element and the yttrium element of the metallic elements included in the oxide sintered body are, for example, equal to or more than 90 atm %, equal to or more than 95 atm %, equal to or more than 98 atm %, equal to or more than 99 atm % or 100 atm %.

The oxide sintered body of the present invention may include a gallium element as a metallic element other than the indium element, the zinc element, the tin element and the yttrium element within the bounds of not impairing the effect of the present invention.

The bulk resistance of the oxide sintered body of the present invention is preferably equal to or less than 10 mΩcm, more preferably equal to or less than 8 mΩcm and particularly preferably equal to or less than 5 mΩcm. The bulk resistance can be measured by a method described in the examples.

When the bulk resistance is high, the target becomes charged at the time of film formation with large power, which can cause abnormal electrical discharges or generate sparks due to an unstable plasma state.

The three-point bending strength of the oxide sintered body of the present invention is preferably equal to or more than 120 MPa, more preferably equal to or more than 140 MPa and more preferably equal to or more than 150 MPa.

When the three-point bending strength is low, because of the low strength of the target, the target is cracked or chipped and solid substances are scattered over the target at the time of sputtering film formation with large power, which can cause abnormal electrical discharges. The three-point bending strength can be evaluated pursuant to JIS R 1601 "Testing method for flexural strength (modulus of rupture) of fine ceramics at room temperature." Specifically, a standard test piece having a width of 4 mm, a thickness of 3 mm and a length of 40 mm is placed on two supports disposed at a given distance (30 mm), a load with a crosshead speed of 0.5 mm/min is applied to the center between the supports.

The evaluation can be made by calculating the bending strength from the maximum load when the test piece has been broken.

The coefficient of linear expansion of the oxide sintered body of the present invention is preferably equal to or less than $8.0 \times 10^{-6}$ $(K^{-1})$, more preferably equal to or less than $7.5 \times 10^{-6}$ $(K^{-1})$ and further more preferably equal to or less than $7.0 \times 10^{-6}$ $(K^{-1})$.

When the coefficient of linear expansion is high, the target is heated during sputtering with large power and expanded, a deformation appears between the target and a copper plate on which the target is bonded, which can cause the target to be microcracked due to a stress and can cause abnormal electrical discharges due to cracking or chipping.

Through the use of a standard test piece having for example a width of 5 mm, a thickness of 5 mm and a length of 10 mm, a displacement caused by thermal expansion when a temperature reaches 300° C. is measured by means of a position detector with a rate of temperature increase set at 5° C./min, so that the coefficient of linear expansion can be evaluated.

The thermal conductivity of the oxide sintered body of the present invention is preferably equal to or more than 5.0 (W/m·K), more preferably equal to or more than 5.5 (W/m·K), further more preferably equal to or more than 6.0 (W/m·K) and most preferably equal to or more than 6.5 (W/m·K).

When the thermal conductivity is low, the temperature of the sputter surface becomes different from that of a bonding surface at the time of sputtering film formation with large power, which can cause the target to be microcracked, cracked or chipped due to an internal stress.

The thermal conductivity can be calculated by determining the specific heat capacity and the thermal diffusivity by a laser flash method through the use of a standard test piece for example having a diameter of 10 mm and a thickness of 1 mm and by multiplying these values with the density of the test piece.

The oxide sintered body according to the second embodiment of the present invention includes an In element, a Zn element, a Sn element and a Y element. The atomic ratios of the Zn element and the In element are within ranges below. The oxide sintered body includes no spinel phase represented by $Zn_2SnO_4$.

$$0.01 \leq Zn/(In+Zn+Y+Sn) \leq 0.25$$

$$0.50 \leq In/(In+Zn+Y+Sn)$$

Thus, a sputtering target can be obtained, which has few cracks during manufacture of the oxide sintered body, has few cracks in a bonding process of bonding the sputtering target on a backing plate, and has few microcracks at the time of film formation with large power during sputtering.

The oxide sintered body according to the second embodiment of the present invention includes no spinel phase represented by $Zn_2SnO_4$, which can be confirmed by examining the crystal structure by means of for example an X-ray diffraction measuring device (XRD).

The atomic ratio represented by Zn/(In+Zn+Y+Sn) of the oxide sintered body according to the second embodiment of the present invention is preferably 0.03 to 0.25, more preferably 0.05 to 0.22 and further more preferably 0.08 to 0.20 from the viewpoint of improving the density of the sintered body and also from the viewpoint of controlling the crystallinity of a resultant oxide semiconductor film.

Moreover, the atomic ratio represented by In/(In+Zn+Y+Sn) is preferably 0.50 to 0.93 and more preferably 0.50 to 0.87 from the viewpoint of improving the density of the sintered body and also from the viewpoint of keeping the mobility of a TFT high.

The oxide sintered body according to the second embodiment of the present invention preferably includes a bixbyite phase represented by $In_2O_3$ and a pyrochlore phase represented by $Y_2Sn_2O_7$.

Thus, the zinc element forms a solid solution with the bixbyite phase represented by $In_2O_3$ and/or with the pyrochlore phase represented by $Y_2Sn_2O_7$, which allows the oxide sintered body to have a high density.

The oxide sintered body includes the bixbyite phase represented by $In_2O_3$ and the pyrochlore phase represented by $Y_2Sn_2O_7$, which can be confirmed by examining the crystal structure by means of for example the above-described X-ray diffraction measuring device (XRD).

From the viewpoint of improving the density of the sintered body and also from the viewpoint of controlling the crystallinity of a resultant oxide semiconductor film and keeping the mobility of a TFT high, the atomic ratios of the Y element and the Sn element of the oxide sintered body according to the second embodiment of the present invention are preferably within the following ranges:

$$0.03 \leq Y/(In+Zn+Y+Sn) \leq 0.25, \text{ and}$$

$$0.03 \leq Sn/(In+Zn+Y+Sn) \leq 0.30.$$

The atomic ratio represented by Y/(In+Zn+Y+Sn) of the oxide sintered body according to the second embodiment of the present invention is preferably 0.05 to 0.22, more preferably 0.05 to 0.20 and further more preferably 0.07 to 0.20 from the viewpoint of controlling the compounds in the oxide sintered body and also from the viewpoint of maintaining the heat resistance of an oxide semiconductor film in a CVD process and a subsequent heat treatment of a process of manufacturing a protective film or an insulating film of a TFT.

Moreover, the atomic ratio represented by Sn/(In+Zn+Y+Sn) is preferably 0.05 to 0.30, more preferably 0.08 to 0.28 and furthermore preferably 0.10 to 0.25 from the viewpoint of controlling the compounds in the oxide sintered body and also from the viewpoint of improving the resistance to a chemical solution for etching a metal of a resultant oxide semiconductor film.

The oxide sintered body according to the third embodiment of the present invention includes an In element, a Zn element, a Sn element and a Y element. The atomic ratios of the Zn element and the In element are within ranges below, wherein the oxide sintered body consists of a bixbyite phase represented by $In_2O_3$ and a pyrochlore phase represented by $Y_2Sn_2O_7$, or the oxide sintered body consists of a bixbyite phase represented by $In_2O_3$, a pyrochlore phase represented by $Y_2Sn_2O_7$ and an indium trizincoindate phase represented by $In((Zn_3In)O_6)$.

$$0.01 \leq Zn/(In+Zn+Y+Sn) \leq 0.25$$

$$0.50 \leq In(In+Zn+Y+Sn)$$

Thus, a sputtering target can be obtained, which has few cracks during manufacture of the oxide sintered body, has few cracks in a bonding process of bonding the sputtering target on a backing plate, and has few microcracks at the time of film formation with large power during sputtering.

The oxide sintered body according to the third embodiment of the present invention includes only the bixbyite phase represented by $In_2O_3$ and the pyrochlore phase represented by $Y_2Sn_2O_7$ or includes only the bixbyite phase represented by $In_2O_3$, the pyrochlore phase represented by $Y_2Sn_2O_7$ and the indium trizincoindate phase represented by $In((Zn_3In)O_6)$, which can be confirmed by examining the crystal structure by means of for example the above-described X-ray diffraction measuring device (XRD).

The atomic ratio represented by Zn/(In+Zn+Y+Sn) of the oxide sintered body according to the third embodiment of the present invention is preferably 0.03 to 0.25, more preferably 0.05 to 0.22 and further more preferably 0.08 to 0.20 from the viewpoint of improving the density of the sintered body and also from the viewpoint of controlling the crystallinity of a resultant oxide semiconductor film.

Moreover, the atomic ratio represented by In/(In+Zn+Y+Sn) is preferably 0.50 to 0.93 and more preferably 0.50 to 0.87 from the viewpoint of improving the density of the sintered body and also from the viewpoint of keeping the mobility of a resultant TFT high.

From the viewpoint of improving the density of the sintered body and also from the viewpoint of controlling the crystallinity of a resultant oxide semiconductor film and keeping the mobility of a TFT high, the atomic ratios of the Y element and the Sn element of the oxide sintered body according to the third embodiment of the present invention are preferably within the following ranges:

0.03≤Y/(In+Zn+Y+Sn)≤0.25, and 0.03≤Sn/(In+Zn+Y+Sn)≤0.30.

The atomic ratio represented by Y/(In+Zn+Y+Sn) of the oxide sintered body according to the third embodiment of the present invention is preferably 0.05 to 0.22, more preferably 0.05 to 0.20 and further more preferably 0.07 to 0.20 from the viewpoint of controlling the compounds in the oxide sintered body and also from the viewpoint of maintaining the heat resistance of an oxide semiconductor film in a CVD process and a subsequent heat treatment of a process of manufacturing a protective film or an insulating film of a TFT.

Moreover, the atomic ratio represented by Sn/(In+Zn+Y+Sn) is preferably 0.05 to 0.30 and more preferably 0.08 to 0.28 and furthermore preferably 0.10 to 0.25 from the viewpoint of controlling the compounds in the oxide sintered body and also from the viewpoint of improving the resistance to a chemical solution for etching a metal of a resultant oxide semiconductor film.

The oxide sintered body of the present invention can be manufactured through a process of preparing mixed powder of raw powder including an indium element, a zinc element, a tin element and a yttrium element, a process of molding the mixed powder to manufacture a molded body, and a process of firing the molded body.

The raw powder is preferably oxide powder, and preferably an indium oxide, a zinc oxide, a tin oxide and an yttrium oxide are used as the raw powder.

The mixing ratio of the raw powder is preferably made to match the atomic ratio of a desired sintered body. As to the oxide sintered body according to the first embodiment of the present invention, it is preferable to mix the powder at a mixing ratio satisfying the following atomic ratios:

0.01≤Zn/(In+Zn+Y+Sn)≤0.25, 0.03≤Y/(In+Zn+Y+Sn)≤0.25, 0.03≤Sn/(In+Zn+Y+Sn)≤0.30, and 0.20≤In/(In+Zn+Y+Sn)≤0.93.

Moreover, as to the oxide sintered bodies according to the second and third embodiments of the present invention, it is preferable to mix the powder at a mixing ratio satisfying the following atomic ratios:

0.01≤Zn/(In+Zn+Y+Sn)≤0.25, and 0.50≤In/(In+Zn+Y+Sn).

Regarding the above mixing ratio, a more preferable mixing ratio is the same as the atomic ratio described regarding the oxide sintered body of each embodiment.

The average particle diameter of the raw powder is preferably 0.1 µm to 2 µm and more preferably 0.5 µm to 1.5 µm. The average particle diameter of the raw powder can be measured by a laser diffraction particle size distribution apparatus or other apparatuses.

A method of mixing and molding the raw materials is not particularly limited and a publicly known method can be used. Moreover, a binder may be added at the time of mixing.

The raw materials can be mixed by a publicly known apparatus such as a ball mill, a bead mill, a jet mill or an ultrasonic apparatus. Conditions such as a time for crushing are appropriately adjusted, but the time for crushing is preferably approximately 6 to 100 hours. As a molding method, for example, the mixed powder can be compression-molded to form a molded body. Through this process, the mixed powder is molded into a product shape (e.g., a preferable shape of a sputtering target).

The mixed powder is loaded into a mold and typically molded at a pressure of for example 100 MPa or more by mold pressing or cold isostatic pressing (CIP), so that a molded body can be obtained.

In the molding process, molding agents such as polyvinyl alcohol, polyethylene glycol, methylcellulose, poly wax, oleic acid and stearic acid may be used.

The resultant molded body is sintered at a sintering temperature of 1200 to 1650° C. for ten hours or more, so that a sintered body can be obtained.

The sintering temperature is preferably 1350 to 1600° C., more preferably 1400 to 1600° C. and further more preferably 1450 to 1600° C. The sintering time is preferably 10 to 50 hours, more preferably 12 to 40 hours and further more preferably 13 to 30 hours.

When the sintering temperature is less than 1200° C. or the sintering time is less than ten hours, the electrical resistance of the target does not sufficiently decrease because of insufficient proceeding of sintering, which can cause abnormal electrical discharges. In contrast, when the firing temperature is more than 1650° C. or the firing time is more than 50 hours, an average crystal grain size increases because of significant crystal grain growth and large holes are generated, which can reduce the strength of the sintered body and generate abnormal electrical discharges.

In a pressureless sintering method, the molded body is sintered (fired) in an air atmosphere or an oxygen gas atmosphere. The oxygen gas atmosphere is preferably an atmosphere in which the oxygen concentration is for example 10 to 50 vol %. Even when a temperature rise process and a retention process (sintering process) are conducted under an air atmosphere, the oxide sintered body of the present invention can be densified.

Moreover, the rate of temperature increase at the time of sintering is preferably 0.1 to 2° C./min from 800° C. to a sintering temperature (1200 to 1650° C.).

Regarding the sintered body of the present invention, sintering proceeds most in a temperature range more than 800° C. When the rate of temperature increase is less than 0.1° C./min in this temperature range, the sintered body cannot be densified because of significant crystal grain growth. In contrast, when the rate of temperature increase is more than 2° C./min, the molded body has a temperature distribution, which can warp or crack the sintered body.

From 800° C. to the sintering temperature, the rate of temperature increase is preferably 0.5 to 2.0° C./min and more preferably 1.0 to 1.8° C./min.

The resultant sintered body undergoes cutting and grinding processes and is bonded on a backing plate, so that the sputtering target of the present invention can be obtained.

In most cases, the surface of the sintered body has a highly-oxidized sintered part and is uneven, and the sintered body needs to be cut into a specified size. In order to suppress abnormal electrical discharges and particle generation during sputtering, the surface may be polished with No. #200 or No. #400 and further with No. #800. As a bonding method, bonding by metallic indium is preferable.

The sputtering target of the present invention can be applied to a DC sputtering method, an RF sputtering method, an AC sputtering method, a pulse DC sputtering method and other methods.

An oxide semiconductor film can be obtained by film formation through the use of the above sputtering target.

The oxide semiconductor film can be produced by a deposition method, a sputtering method, an ion plating method, a pulse laser deposition method or other methods through the use of the above target.

The oxide semiconductor film of the present invention has the following atomic ratios:

$$0.01 \leq Zn/(In+Zn+Y+Sn) \leq 0.25,$$

$$0.03 \leq Y/(In+Zn+Y+Sn) \leq 0.25,$$

$$0.035 \leq Sn/(In+Zn+Y+Sn) \leq 0.30, \text{ and}$$

$$0.20 \leq In/(In+Zn+Y+Sn) \leq 0.93.$$

When the atomic ratio represented by $Zn/(In+Zn+Y+Sn)$ is less than 0.01, the oxide semiconductor film is crystallized and interfaces of large crystal gains are generated, which can make the mobility small when a TFT is formed. When the atomic ratio is more than 0.25, the etching rate of the oxide semiconductor film cannot be controlled as it becomes too high, or the surface of the oxide semiconductor film can be dissolved as the chemical resistance of a resist to a stripping solution decreases. Moreover, when the atomic ratio is more than 0.25, and a semiconductor layer of a thin-film transistor (TFT) is formed by using a sputtering target manufactured from the sintered body, only a TFT lacking in stability can be obtained.

The atomic ratio represented by $Zn/(In+Zn+Y+Sn)$ is preferably 0.03 to 0.25, more preferably 0.05 to 0.22 and further more preferably 0.08 to 0.20.

When the atomic ratio represented by $Y/(In+Zn+Y+Sn)$ is less than 0.03, the film cannot be turned into a semiconductor and can be an electric conductor, so that only a TFT lacking in stability can be obtained. Moreover, when the atomic ratio is more than 0.25, the film cannot be turned into a semiconductor and can be turned into an insulator.

The atomic ratio represented by $Y/(In+Zn+Y+Sn)$ is preferably 0.05 to 0.22, more preferably 0.05 to 0.20 and further more preferably 0.07 to 0.20.

When the atomic ratio represented by $Sn/(In+Zn+Y+Sn)$ is less than 0.03, the film can be dissolved in mixed acid made of phosphoric acid, nitric acid and acetic acid being etching liquid of a wiring metal, so that a back channel TFT, which is a structure of a TFT, cannot be formed. In contrast, when the atomic ratio is more than 0.30, the film cannot be etched by organic acid such as oxalic acid, so that a TFT cannot be formed.

The atomic ratio represented by $Sn/(In+Zn+Y+Sn)$ preferably 0.05 to 0.30, more preferably 0.08 to 0.28 and further more preferably 0.10 to 0.25.

The atomic ratio represented by $In/(In+Zn+Y+Sn)$ is 0.20 to 0.93.

When the composition ratio of the indium element in the oxide semiconductor film is high, a TFT having a high mobility, which is a TFT characteristic, can be obtained. Thus, the composition ratio is preferably high. However, its amount is determined from the additive amount of each additive element taking desired TFT characteristics into account.

The atomic ratio represented by $In/(In+Zn+Y+Sn)$ is preferably 0.25 to 0.87 and more preferably 0.50 to 0.87.

The content (atomic ratio) of each metallic element in the oxide semiconductor film of the present invention can be determined by measuring the amount of presence of each element by for example an ICP (Inductively Coupled Plasma) measurement.

The oxide semiconductor film of the present invention may be amorphous.

The oxide semiconductor film of the present invention can be manufactured by using the sputtering target of the present invention. In this case, of an RF sputtering method, a DC sputtering method, an ion plating method and other methods, film formation by a DC sputtering method is preferable.

An oxide thin film such as the above oxide semiconductor film, which can be obtained from the sputtering target of the present invention, can be used for a TFT and particularly preferably used as a channel layer. The device configuration of the TFT is not particularly limited, and publicly known various device configurations can be adopted.

Figure 6:
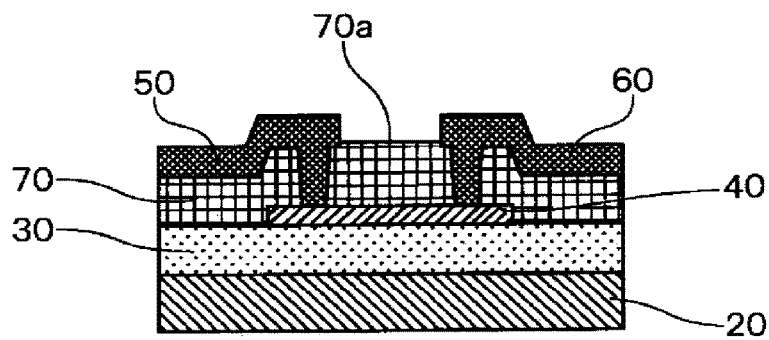
FIG. 6 shows one embodiment of a TFT of the present invention.

FIG. 6 shows one example of the TFT of the present invention. Regarding this TFT, a semiconductor film 40, which is the oxide semiconductor of the present invention, is formed on a gate insulating film 30 on a silicon wafer (gate electrode) 20, and interlayer insulating films 70 and 70a are formed. The interlayer insulating film 70a on the semiconductor film 40 functions as a layer for protecting a channel layer. A source electrode 50 and a drain electrode 60 are provided on the semiconductor film.

Figure 7:
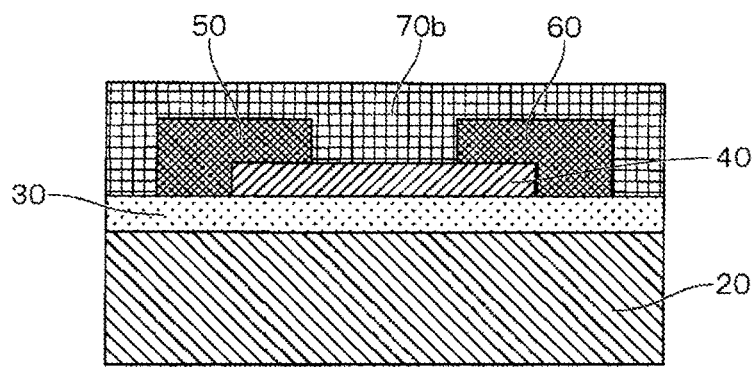
FIG. 7 shows one embodiment of the TFT of the present invention.

FIG. 7 shows one example of the TFT of the present invention. Regarding this TFT, a semiconductor film 40, which is the oxide semiconductor of the present invention, is formed on a gate insulating film (e.g., $SiO_2$) 30 on a silicon wafer (gate electrode) 20. A source electrode 50 and a drain electrode 60 are provided on the semiconductor film 40, and a protecting layer 70b (e.g., $SiO_2$ film formed by CVD) is provided on the semiconductor film 40, the source electrode 50 and the drain electrode 60.

Regarding the silicon wafer 20 and the gate insulating film 30, a silicon wafer with a thermally oxidized film may be used with the silicon wafer as a gate electrode and with the thermally oxidized film ($SiO_2$) as a gate insulating film.

Moreover, in FIGS. 6 and 7, the gate electrode 20 may be formed on a substrate made of glass or other materials.

The band gap of the oxide semiconductor film of the present invention is preferably equal to or more than 3.0 eV. When the band gap is equal to or more than 3.0 eV, light having a wavelength longer than approximately 420 nm is not absorbed. Thus, light from a light source of an organic EL or a TFT-LCD is not absorbed, and, when the oxide semiconductor film is used as a channel layer of a TFT, light of the TFT does not cause misoperation, and the photostability can be improved. The band gap is preferably equal to or more than 3.1 eV and more preferably equal to or more than 3.3 eV.

A material for forming each of the drain electrode, the source electrode and the gate electrode of the TFT of the present invention is not particularly limited and can be arbitrarily selected from typically used materials. For example, a transparent electrode made of indium tin oxide (ITO), indium oxide zinc (IZO), ZnO, $SnO_2$, or other materials, a metal electrode made of Al, Ag, Cu, Cr, Ni, Mo, Au, Ti, Ta, or other materials, a metal electrode made of alloy including these materials or a laminated electrode can be used. Moreover, a silicon wafer may be used as a substrate. In this case, the silicon wafer also functions as an electrode.

Materials for forming the insulating film and the protective film of the TFT of the present invention are not particularly limited and can be arbitrarily selected from typically used materials. Specifically, for example, compounds such as $SiO_2$, $SiNx$, $Al_2O_3$, $Ta_2O_5$, $TiO_2$, MgO, $ZrO_2$, $CeO_2$, $K_2O$, $Li_2O$, $Na_2O$, $Rb_2$, $Sc_2O_3$, $Y_2O_3$, $HfD_2$, $CaHfO_3$, $PbTiO_3$, $BaTa_2O$, $SrTiO_3$, $Sm_2O_3$ and AlN can be used.

When the TFT of the present invention is a back channel etch (bottom gate) TFT, the TFT is preferably provided with a protective film over a drain electrode, a source electrode and a channel layer. The provision of the protective film facilitates improvement of the durability even when the TFT is driven for a long time. In addition, in the case of a top gate TFT, it has a structure in which, for example, a gate insulating film is formed on a channel layer.

The protective film or the insulating film can be formed by for example CVD, but, at this time, the process can be performed at a high temperature. Moreover, since the protective film or the insulating film mostly includes impurity gas immediately after film formation, it is preferable to perform a heat treatment (annealing treatment). The protective film or the insulating film is stabilized by removing the impurity gas by the heat treatment, which facilitates formation of a TFT device having a high durability.

Since use of the oxide semiconductor film of the present invention makes the TFT less susceptible to the temperature in a CVD process and a subsequent heat treatment, the stability of TFT characteristics can be improved even when the protective film or the insulating film has been formed.

EXAMPLES

Hereinafter, examples of the present invention will be described with comparative examples. However, the present invention is not limited to these examples.

Examples 1 to 9

Zinc oxide powder, yttrium oxide powder, tin oxide powder and indium oxide powder were weighed so as to have atomic ratios shown in Table 1 (Table 1-1 and Table 1-2 are collectively referred to as Table 1), put in a polyethylene pot, and mixed and crushed by a dry-type ball mill for 72 hours, thereby preparing mixed powder.

This mixed powder was put in a mold, and a press-molded body was formed under a pressure of 500 kg/cm$^2$. This molded body was densified by CIP under a pressure of 2000 kg/cm$^2$. Next, this molded body was placed in a firing furnace and kept in an air atmosphere at 350° C. for three hours. Subsequently, the molded body was heated at 100° C./h and sintered at 1450° C. for 20 hours. After that, the molded body was left to cool, so that an oxide sintered body was obtained.

Figure 2:
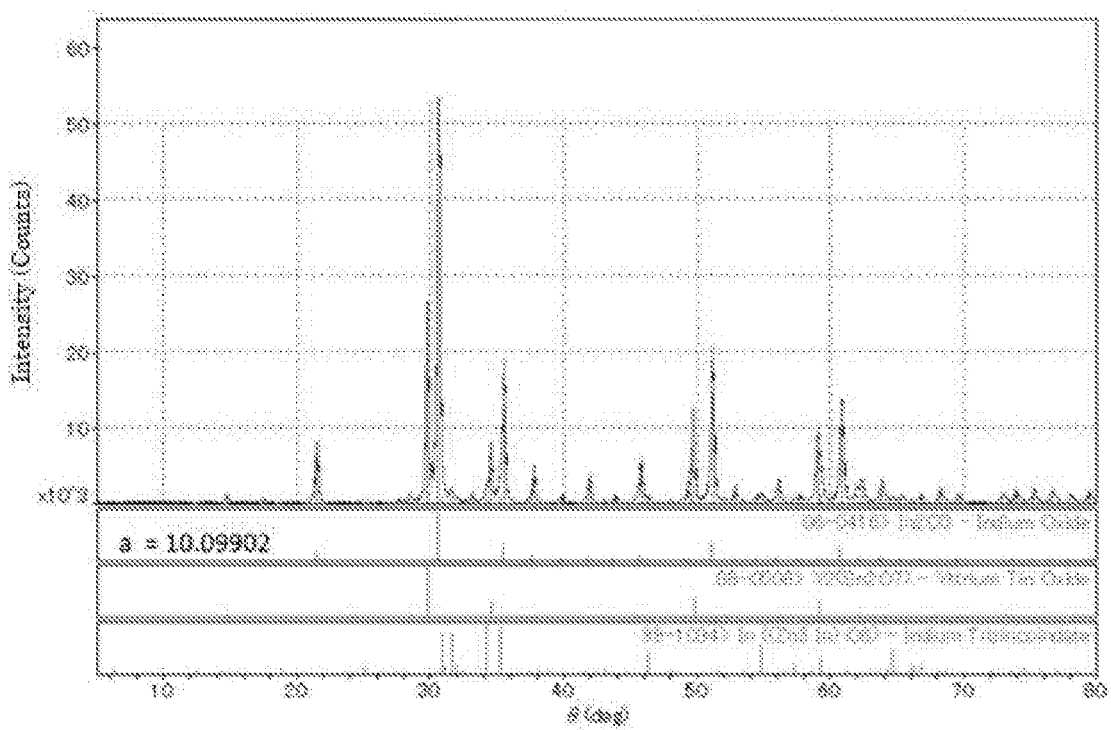
FIG. 2 shows an X-ray diffraction pattern of an oxide sintered body produced in Example 2.
Figure 3:
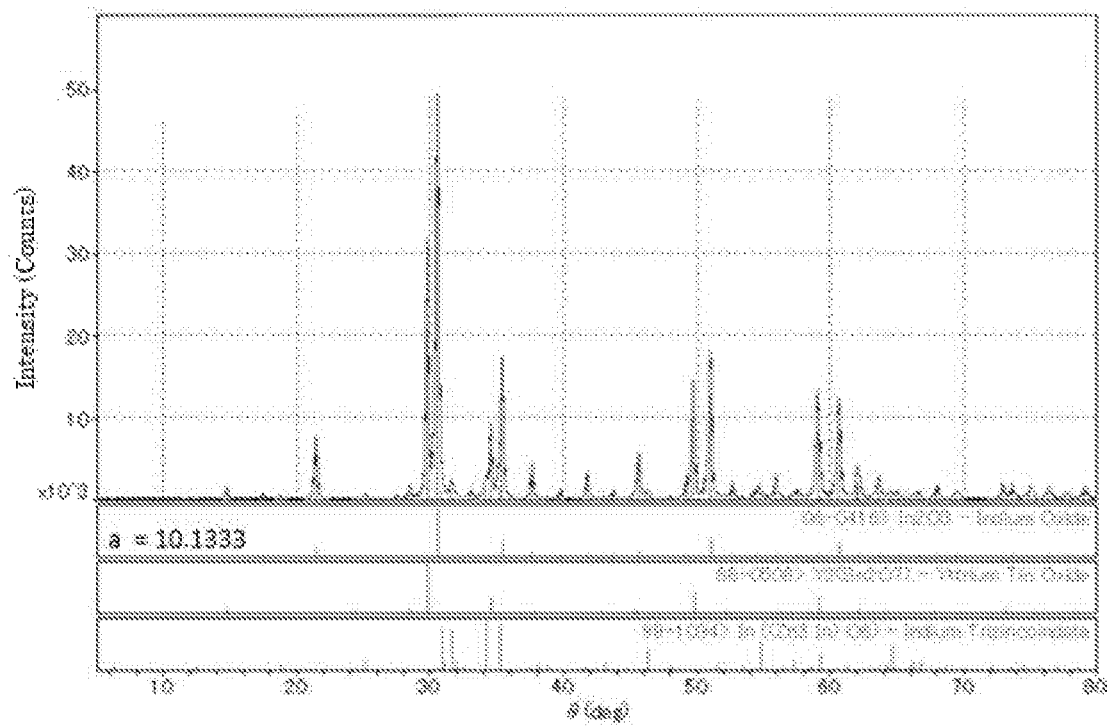
FIG. 3 shows an X-ray diffraction pattern of an oxide sintered body produced in Example 3.
Figure 4:
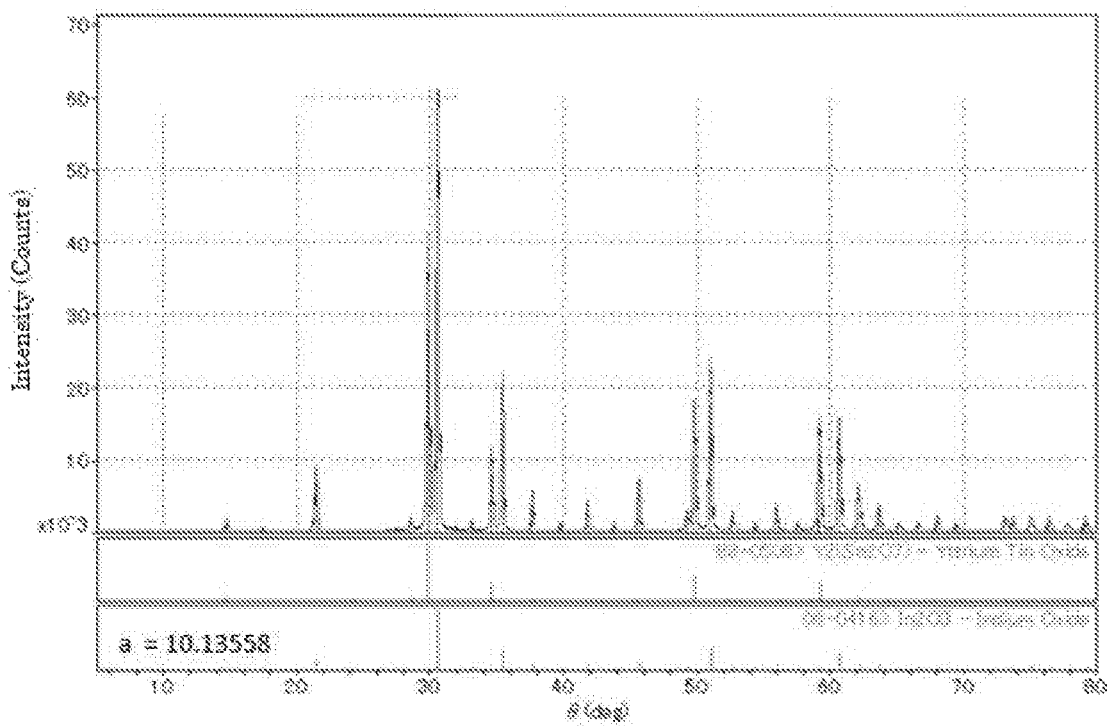
FIG. 4 shows an X-ray diffraction pattern of an oxide sintered body produced in Comparative Example 1.
Figure 5:
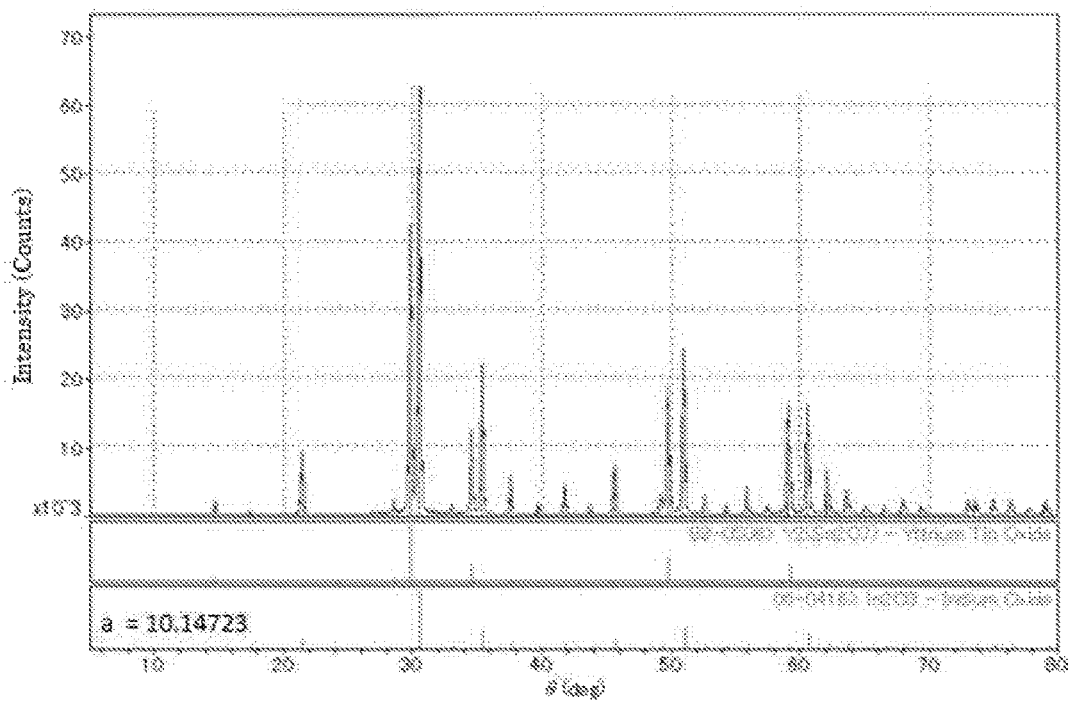
FIG. 5 shows an X-ray diffraction pattern of an oxide sintered body produced in Comparative Example 2.

The crystal structure of the resultant sintered body was examined by an X-ray diffraction measuring device (XRD). FIGS. 1 to 3 show XRD charts of the sintered bodies of Examples 1 to 3, respectively.

As a result of analyzing the charts by a JADE6, it was confirmed that the sintered bodies of Examples 1 to 9 include a bixbyite phase represented by $In_2O_3$ and a pyrochlore phase represented by $Y_2Sn_2O_7$. It was also confirmed that the sintered bodies of Examples 2 to 4, 6, 8 and 9 further include an indium trizincoindate (IndiumTrizincoindate) phase represented by $In((Zn_3In)O_6)$.

Since the lattice constants of the bixbyite structures represented by $In_2O_3$ in Examples 1 and 2 are 10.06889 Å and 10.09902 Å, respectively, it can be understood that, in Examples 1 and 2, the zinc element forms a substitutional solid solution with the bixbyite phase represented by $In_2O_3$. In Example 3, since the lattice constant of the bixbyite structure represented by $In_2O_3$ is 10.13330 Å, it can be understood that, in Example 3, the yttrium element forms a substitutional solid solution with the bixbyite phase represented by $In_2O_3$.

The following is measurement conditions of the XRD. The lattice constant was determined from the resultant X-ray diffraction:
Apparatus: Smartlab manufactured by Rigaku Corporation
X-ray: Cu-Kα ray (having a wavelength of 1.5418 Å and made monochromatic by a graphite monochromator)
2θ-θ reflection method, continuous scan (2.0°/min)
Sampling interval: 0.02°
Slit DS (divergence slit), SS (scattering slit), RS (receiving slit): 1 mm.

The following matters of the sintered bodies obtained in Examples 1 to 9 were evaluated. Table 1 shows the results.
(1) Element Composition Ratio (Atomic Ratio)
The element composition in the sintered body was measured by an inductively coupled plasma atomic emission spectroscopy device (ICP-AES).
(2) Lattice Constant of the Bixbyite Structure
The lattice constant of the bixbyite structure was confirmed from the XRD results used to confirm the crystal structure.
(3) Relative Density
The relative density was calculated by measuring the actual density of the manufactured oxide sintered body by an Archimedes method and dividing this actual density by the calculated density of the oxide sintered body. The calculated density was calculated by dividing the total weight of the raw powder used to manufacture the oxide sintered body by the total volume thereof.
(4) Bulk Resistance
The bulk resistance (conductivity) of the sintered body was measured by a four probe method through the use of a resistance meter (Loresta AX MCP-T370 manufactured by Mitsubishi Chemical Analytech Co., Ltd.).
(5) Proportion of Presence of Each Crystalline Phase
The proportion (wt %) of presence of each crystalline phase of the resultant sintered body was calculated as a ratio of presence from the XRD chart by a whole pattern fitting (WPF) method.

TABLE 1

|  |  | Example 1 | Example 2 | Example 3 |
|---|---|---|---|---|
| Weight Ratio (wt %) | ZnO | 7.5 | 7.5 | 7.5 |
|  | $Y_2O_3$ | 8 | 12 | 16 |
|  | $SnO_2$ | 20 | 20 | 20 |
|  | $In_2O_3$ | 64.5 | 60.5 | 56.5 |
| Atomic ratio | Zn/(In + Zn + Y + Sn) | 0.12 | 0.12 | 0.12 |
|  | Y/(In + Zn + Y + Sn) | 0.09 | 0.14 | 0.18 |
|  | Sn/(In + Zn + Y + Sn) | 0.18 | 0.17 | 0.17 |
|  | In/(In + Zn + Y + Sn) | 0.61 | 0.57 | 0.53 |
| Lattice constant of bixbyite structure [Å] |  | 10.06889 | 10.09902 | 10.1333 |
| Relative density [%] |  | 100.89 | 101.21 | 101.69 |
| Measured density [g/cm³] |  | 6.80 | 6.69 | 6.61 |
| Calculated density (theoretical density) [g/cm³] |  | 6.74 | 6.61 | 6.50 |
| Bulk resistance [mΩ · cm] |  | 1.47 | 2.53 | 4.86 |
| Crystalline phase by XRD |  | $In_2O_3$ (85.8 wt %) $Y_2Sn_2O_7$ (14.2 wt %) | $In_2O_3$ (74.2 wt %) $Y_2Sn_2O_7$ (22.2 wt %) $In((Zn_3In)O_6)$(3.6 wt %) | $In_2O_3$ (68.6 wt %) $Y_2Sn_2O_7$ (26.8 wt %) $In((Zn_3In)O_6)$(4.6 wt %) |

|  |  | Example 4 | Example 5 |
|---|---|---|---|
| Weight Ratio (wt %) | ZnO | 5.0 | 3.0 |
|  | $Y_2O_3$ | 12 | 12 |
|  | $SnO_2$ | 20 | 20 |
|  | $In_2O_3$ | 63.0 | 65.0 |
| Atomic ratio | Zn/(In + Zn + Y + Sn) | 0.08 | 0.05 |
|  | Y/(In + Zn + Y + Sn) | 0.14 | 0.14 |
|  | Sn/(In + Zn + Y + Sn) | 0.18 | 0.18 |
|  | In/(In + Zn + Y + Sn) | 0.60 | 0.63 |
| Lattice constant of bixbyite structure [Å] |  | 10.10012 | 10.10829 |
| Relative density [%] |  | 100.8 | 100.1 |
| Measured density [g/cm³] |  | 6.71 | 6.70 |
| Calculated density (theoretical density) [g/cm³] |  | 6.66 | 6.69 |
| Bulk resistance [mΩ · cm] |  | 4.52 | 4.97 |
| Crystalline phase by XRD |  | $In_2O_3$ (75.2 wt %) $Y_2Sn_2O_7$ (21.3 wt %) $In((Zn_3In)O_6)$(3.5 wt %) | $In_2O_3$ (79.5 wt %) $Y_2Sn_2O_7$ (20.7 wt %) |

|  |  | Example 6 | Example 7 | Example 8 | Example 9 |
|---|---|---|---|---|---|
| Weight ratio (wt %) | ZnO | 7.5 | 7.5 | 7.5 | 9.9 |
|  | $Y_2O_3$ | 12 | 12 | 10 | 12 |
|  | $SnO_2$ | 10 | 5 | 5 | 20 |
|  | $In_2O_3$ | 70.5 | 75.5 | 77.5 | 58.1 |
| Atomic ratio | Zn/(In + Zn + Y + Sn) | 0.119 | 0.119 | 0.119 | 0.156 |
|  | Y/(In + Zn + Y + Sn) | 0.138 | 0.137 | 0.115 | 0.137 |
|  | Sn/(In + Zn + Y + Sn) | 0.086 | 0.043 | 0.043 | 0.170 |
|  | In/(In + Zn + Y + Sn) | 0.657 | 0.701 | 0.723 | 0.537 |
| Lattice constant of bixbyite structure [Å] |  | 10.16484 | 10.18103 | 10.19811 | 10.1063 |
| Relative density [%] |  | 100.33 | 100.15 | 100.15 | 100.30 |
| Measured density [g/cm³] |  | 6.66 | 6.66 | 6.72 | 6.60 |
| Calculated density (theoretical density) [g/cm³] |  | 6.64 | 6.65 | 6.71 | 6.58 |
| Bulk resistance [mΩ · cm] |  | 2.0 | 3.1 | 2.2 | 4.2 |
| Crystalline phase by XRD |  | $In_2O_3$ (85.1 wt %) $Y_2Sn_2O_7$ (10.5 wt %) $In((Zn_3In)O_6)$(4.4 wt %) | $In_2O_3$ (89.5 wt %) $Y_2Sn_2O_7$ (10.5 wt %) | $In_2O_3$ (85.1 wt %) $Y_2Sn_2O_7$ (10.7 wt %) $In((Zn_3In)O_6)$(4.2 wt %) | $In_2O_3$ (74.2 wt %) $Y_2Sn_2O_7$ (21.2 wt %) $In((Zn_3In)O_6)$(4.6 wt %) |

Comparative Examples 1 to 4

Yttrium oxide powder, tin oxide powder, indium oxide powder and zinc oxide powder were used to have atomic ratios shown in Table 2 (the zinc oxide powder was not used in Comparative Examples 1 and 2). Except this, sintered bodies were manufactured and evaluated in the same manner as Examples 1 to 9. Table 2 shows the results.

TABLE 2

|  |  | Comparative Example 1 | Comparative Example 2 | Comparative Example 3 | Comparative Example 4 |
|---|---|---|---|---|---|
| Weight ratio (wt %) | ZnO | 0 | 0 | 7.5 | 7.5 |
|  | $Y_2O_3$ | 12 | 16 | 12 | 12 |
|  | $SnO_2$ | 20 | 20 | 36 | 40 |
|  | $In_2O_3$ | 68 | 64 | 44.5 | 40.5 |
| Atomic ratio | Zn/(In + Zn + Y + Sn) | 0 | 0 | 0.12 | 0.12 |
|  | Y/(In + Zn + Y + Sn) | 0.15 | 0.19 | 0.14 | 0.14 |
|  | Sn/(In + Zn + Y + Sn) | 0.18 | 0.18 | 0.32 | 0.35 |
|  | In/(In + Zn + Y + Sn) | 0.67 | 0.63 | 0.42 | 0.39 |
| Lattice constant of bixbyite structure [Å] |  | 10.13558 | 10.14723 | 10.0758 | 10.02991 |
| Relative density [%] |  | 66.17 | 60.73 | 85.1 | 86.5 |
| Measured density [g/cm³] |  | 4.46 | 4.02 | 5.60 | 5.71 |
| Calculated density (theoretical density) [g/cm³] |  | 6.74 | 6.62 | 6.58 | 6.60 |
| Bulk resistance [mΩ · cm] |  | 11.6 | 312 | 5440 | 317 |
| Crystalline phase by XRD |  | $In_2O_3$ with which Y forms a solid solution (68.4 wt %) $Y_2Sn_2O_7$ (31.6 wt %) | $In_2O_3$ with which Y forms a solid solution (67.4 wt %) $Y_2Sn_2O_7$ (32.6 wt %) | $In_2O_3$ (78.1 wt %) $Y_2Sn_2O_7$ (21.9 wt %) | $In_2O_3$ (73.8 wt %) $Y_2Sn_2O_7$ (26.2 wt %) |

Examples 10, 11, 14, 15 and 16

<Manufacture of a Thin-Film Transistor (TFT)>

(1) Film Formation Process

A sputtering target was manufactured by using each of the sintered bodies shown in Table 3, which were obtained in Examples 2, 3, 1, 6 and 7. By using the sputtering target, a thin film (semiconductor film) having a thickness of 50 nm was formed by sputtering on a silicon wafer (gate electrode) with a thermally oxidized film (gate insulating film) via a metallic mask. As sputtering gas, mixed gas of high-purity argon and high-purity oxygen were used. Table 3 shows the results.

(2) Formation of Source and Drain Electrodes

As source and drain electrodes, a titanium metal was film-formed by sputtering through the use of a metallic mask. The resultant laminated body was heat-treated in an atmosphere at 350° C. for 30 minutes, so that a TFT was completed.

(3) Formation of a Protective Insulating Film

On the heat-treated semiconductor film of the TFT obtained in Paragraph (2), an $SiO_2$ film (protective insulating film) was formed by chemical vapor deposition (CVD) at a substrate temperature of 350° C. and then a heat treatment was conducted as post annealing at 350° C. for 30 minutes.

<Manufacture and Characteristic Evaluation of the Semiconductor Film>

Atomic Ratio

The element composition in the semiconductor film was measured by an inductively coupled plasma atomic emission spectroscopy device (ICP-AES). Table 3 shows the results.

Measurement of the Hall Effect

A sample in which only a semiconductor film was placed on a glass substrate was film-formed, a Hall measurement was conducted in each stage of the above manufacture of the TFT, and an increase or decrease in the carrier density was measured. Specifically, the measurement was conducted in the manner described below. Table 3 shows the results.

As in the TFT manufacturing process, a semiconductor film having a thickness of 50 nm was formed on a glass substrate and heat-treated at 350° C. for 30 minutes. After that, the film was cut into 1 cm square, a film of gold (Au) was formed into a square having a size of approximately 2 mm×2 mm or less on four corners by anion coater through the use of a metallic mask, and indium solder was placed on the Au metal for better contact. This was used as a sample for measuring the Hall effect.

As the glass substrate, an ABC-G manufactured by Nippon Electric Glass Co., Ltd. was used.

The Hall effect measuring sample was set in a Hall effect and resistivity measuring apparatus (ResiTest8300 type manufactured by TOYO Corporation). The Hall effect was evaluated at a room temperature, and the carrier density and the mobility were determined.

An $SiO_2$ film was formed on the semiconductor film of the Hall effect measuring sample at a substrate temperature of 350° C. by a CVD device, and then a Hall measurement was conducted. A Hall measurement was further conducted after a heat treatment at 350° C. for 30 minutes. A needle for measurement was inserted into the $SiO_2$ film to reach the layer made of gold, and a contact was made.

Crystal Characteristics of the Semiconductor Film

Crystalline substances of the unheated film and the heated film after sputtering (after film deposition) were evaluated by an X-ray diffraction (XRD) measurement. As a result, the film was amorphous before the heating and also amorphous after the heating.

Band Gap of the Semiconductor Film

By using a sputtering target manufactured from each of the sintered bodies of Examples 2, 3, 1, 6 and 7 shown in Table 3, a semiconductor film was formed on a quartz substrate by sputtering, and the transmission spectrum of a thin-film test sample which has been heat-treated at 350° C. for 30 minutes was measured. After converting a wavelength of a horizontal axis into energy (eV) and a transmittance of a vertical axis into $(\alpha h\nu)^2$ ($\alpha$ is an absorption coefficient, h is the Planck's constant, and v is the number of vibrations), an eV value at a point of intersection of a line fitted to a part where the absorption rises with a base line was calculated.

<Characteristic Evaluation of the TFT>

The following characteristics of the TFT obtained in Paragraph (2) above and the TFT obtained in Paragraph (3) above where the $SiO_2$ protective film was formed were evaluated. The TFT obtained in Paragraph (3) above was evaluated by inserting a needle for measurement into the $SiO_2$ film to reach the layer of metal titanium. Table 3 shows the results.

Saturation Mobility

A saturation mobility was determined from a transfer characteristic when a drain voltage of 5 V was applied. Specifically, a graph of a transfer characteristic Id-Vg was drawn, the transformer conductance (Gm) of each Vg was calculated, and a saturation mobility was derived from a formula in a linear region. In addition, the Gm was represented by $\partial(Id)/\partial(Vg)$, the Vg was applied from −15 to 25 V, and the maximum mobility in this range was defined as the saturation mobility. Unless otherwise specified, the saturation mobility was evaluated by this method in the present invention. The above Id was a current between the source and drain electrodes, and the Vg was a gate voltage when a voltage Vd was applied between the source and drain electrodes.

Threshold Voltage

From the graph of transfer characteristics, a threshold voltage (Vth) was defined as the Vg when the Id is $10^{-9}$ A.

On/Off Ratio

A value of the Id when the Vg was −10 V was defined as an Off-current value, a value of the Id when the Vg was 20 V was defined as an On-current value, and the ratio [On/Off] was determined.

TABLE 3

| | | Example 10 | Example 11 | Example 14 | Example 15 | Example 16 |
|---|---|---|---|---|---|---|
| | Used sintered body | Example 2 | Example 3 | Example 1 | Example 6 | Example 7 |
| Atomic ratio of semiconductor film | Zn/(In + Zn + Y + Sn) | 0.12 | 0.12 | 0.12 | 0.119 | 0.119 |
| | Y/(In + Zn + Y + Sn) | 0.14 | 0.18 | 0.09 | 0.138 | 0.137 |
| | Sn/(In + Zn + Y + Sn) | 0.17 | 0.17 | 0.18 | 0.086 | 0.043 |
| | In/(In + Zn + Y + Sn) | 0.57 | 0.53 | 0.61 | 0.657 | 0.701 |
| Conditions of formation of semiconductor film | Atmosphere gas | Ar + $O_2$ | Ar + $O_2$ | Ar + $O_2$ | Ar + $O_2$ | Ar + $O_2$ |
| | Back pressure (Pa) before film formation | $5 \times 10^{-4}$ | $5 \times 10^{-4}$ | $5 \times 10^{-4}$ | $5 \times 10^{-4}$ | $5 \times 10^{-4}$ |
| | Sputter pressure (Pa) at time of film formation | 0.5 | 0.5 | 0.5 | 0.5 | 0.5 |
| | Substrate temperature (° C.) at time of film formation | Room temperature | 150° C. | Room temperature | Room temperature | Room temperature |
| | Oxygen partial pressure (%) at time of film formation | 1 | 1 | 10 | 1 | 1 |
| Conditions of heat treatment after formation of semiconductor film | Heat treatment: Temperature (° C.) | 350 | 350 | 350 | 350 | 350 |
| | Rate of temperature increase (° C./min) | 10 | 10 | 10 | 10 | 10 |
| | Time (min) | 30 | 30 | 30 | 30 | 30 |
| | Atmosphere | Air atmosphere | Air atmosphere | Air atmosphere | Air atmosphere | Air atmosphere |
| Characteristics of semiconductor film after heat treatment | Flim thickness (nm) | 50 | 50 | 50 | 50 | 50 |
| | Hall measurement carrier density ($cm^{-3}$) | $8.0 \times 10^{13}$ | $5.7 \times 10^{14}$ | $3.3 \times 10^{17}$ | $7.6 \times 10^{15}$ | $1.7 \times 10^{16}$ |
| | Hall measurement mobility ($cm^2/V \cdot sec$) | 1.8 | 0.3 | 15.3 | 13.4 | 14.4 |
| | Crystallinity immediately after film deposition (XRD) | Amorphous | Amorphous | Amorphous | Amorphous | Amorphous |
| | Crystallinity immediately after heating (XRD) | Amorphous | Amorphous | Amorphous | Amorphous | Amorphous |
| | Bandgap of semiconductor thin film (eV) | 4.06 | 4.05 | 3.3 | 3.2 | 3.1 |
| TFT characteristics after heat treatment | Saturation mobility ($cm^2/V \cdot sec$) | 6.2 | 0.7 | 14.5 | 8.3 | 11.4 |
| | Vth(V) | 0.7 | 2.3 | −1.2 | −0.7 | −0.9 |
| | On/off ratio | $>10^8$ | $>10^7$ | $>10^7$ | $>10^8$ | $>10^8$ |
| | Off current (A) | $<10^{-12}$ | $<10^{-12}$ | $<10^{-11}$ | $<10^{-12}$ | $<10^{-11}$ |
| Characteristics of semiconductor film after $SiO_2$ film formation by CVD at substrate temperature 350° C. | Hall measurement carrier density ($cm^{-3}$) | $1.9 \times 10^{19}$ | $5.9 \times 10^{18}$ | $5.5 \times 10^{19}$ | $6.3 \times 10^{19}$ | $7.4 \times 10^{19}$ |
| | Hall measurement mobility ($cm^2/V \cdot sec$) | 10.6 | 9.7 | 20.5 | 16.5 | 18.7 |

TABLE 3-continued

|  |  | Example 10 | Example 11 | Example 14 | Example 15 | Example 16 |
|---|---|---|---|---|---|---|
| Characteristics after heat treatment after SiO$_2$ film formation by CVD | Heat treatment: Temperature (° C.) | 350 | 350 | 350 | 350 | 350 |
|  | Time (min) | 30 | 30 | 30 | 30 | 30 |
|  | Atmosphere | Air atmosphere | Air atmosphere | Air atmosphere | Air atmosphere | Air atmosphere |
|  | Hall measurement carrier density (cm$^{-3}$) | $7.3 \times 10^{16}$ | $4.0 \times 10^{16}$ | $6.7 \times 10^{18}$ | $1.6 \times 10^{18}$ | $2.2 \times 10^{18}$ |
|  | Hall measurement mobility (cm$^2$/V · sec) | 9.8 | 7.3 | 43.4 | 8.7 | 10.7 |
| TFT Characteristics after heat treatment after SiO$_2$ film formation by CVD | Saturation mobility (cm$^2$/V · sec) | 21.8 | 24.7 | 18.4 | 17.9 | 15.6 |
|  | Vth(V) | 0.8 | 1.3 | −1.4 | −2.1 | −4.1 |
|  | On/off ratio | >10$^8$ | >10$^8$ | >10$^7$ | >10$^7$ | >10$^7$ |
|  | Off current (A) | <10$^{-12}$ | <10$^{-12}$ | <10$^{-10}$ | <10$^{-10}$ | <10$^{-10}$ |

Examples 12 and 13 and Comparative Example 5

A sputtering target was manufactured by using each of the sintered bodies obtained in Examples 2 and 3 and Comparative Example 1. The durability of the sputtering target was tested as follows:

Under the sputtering conditions for forming the semiconductor film shown in Table 3, a target surface after continuous operation for ten hours with DC film formation power of 400 W was observed. The target surfaces obtained by using the sintered bodies of Examples 2 and 3 were not largely changed except generation of erosion. In contrast, in the case of the target obtained by using the sintered body of Comparative Example 1, there were a number of black foreign substances at an erosion part. Moreover, hairline cracks were observed. Furthermore, when the number of abnormal electrical discharges were measured by a micro arc counter, in the case of the targets obtained by using the sintered bodies of Examples 2 and 3, few arcs were measured. In contrast, in the case of the target obtained by using the sintered body of Comparative Example 1, a number of arcs were generated.

Compared with an HIP, a spark plasma sintering (SPS) or a technology using an oxygen atmosphere furnace, it is difficult to increase the density of a sintered body when it is fired under an air atmosphere. However, as shown in Table 1, it can be understood that the sintered body of the present example has a high density even though it is simply fired under an air atmosphere. Moreover, the oxide semiconductor films having the composition shown in Table 3 are useful as a thin-film transistor.

INDUSTRIAL APPLICABILITY

The sintered body of the present invention can be used as a sputtering target, and the resultant sputtering target can be used when an oxide semiconductor thin film of a thin-film transistor is manufactured by a vacuum process such as a sputtering method.

Several embodiments and/or examples of the present invention have been described in detail above. However, without substantially departing from novel teachings and effects of the present invention, the person skilled in the art can readily make a number of modifications to the embodiments and/or examples which are exemplifications of these teachings and effects. Thus, these modifications are included in the scope of the present invention.

Those described in the specification of Japanese applications on the basis of which the present application claims Paris convention priority are incorporated herein by reference in its entirety.

The invention claimed is:

1. An oxide sintered body comprising an oxide including an In element, a Zn element, a Sn element and a Y element, wherein
    the oxide sintered body density is equal to or more than 100.01% of a theoretical density,
    the oxide sintered body is mainly composed of the bixbyite phase represented by In$_2$O$_3$
    and atomic ratios of the Zn element, the Y element, the Sn element and the In element are within the following ranges:

$0.01 \leq Zn/(In+Zn+Y+Sn) \leq 0.25$, $0.03 \leq Y/(In+Zn+Y+Sn) \leq 0.25$, $0.03 \leq Sn/(In+Zn+Y+Sn) \leq 0.30$, and $0.20 \leq In/(In+Zn+Y+Sn) \leq 0.93$.

2. The oxide sintered body according to claim 1, wherein the oxide sintered body includes a pyrochlore phase represented by Y$_2$Sn$_2$O$_7$.

3. The oxide sintered body according to claim 2, wherein any one or more of the Y element and the Zn element form a substitutional solid solution with the bixbyite phase.

4. A sputtering target comprising the oxide sintered body according to claim 1.

5. An oxide semiconductor film formed by sputtering a sputtering target according to claim 4.

6. The oxide semiconductor film according to claim 5, wherein the oxide semiconductor film is amorphous.

7. A thin-film transistor comprising the oxide semiconductor film according to claim 5.

8. The oxide sintered body according to claim 1, wherein the proportion of presence of the bixbyite phase represented by In$_2$O$_3$ in the oxide sintered body is equal to or more than 50 wt %.

9. An oxide sintered body comprising an In element, a Zn element, a Sn element and a Y element, wherein
    atomic ratios of the Zn element and the In element are within ranges below,
    the sintered oxide body includes no spinel phase represented by Zn$_2$SnO$_4$, and
    the oxide sintered body is mainly composed of the bixbyite phase represented by In$_2$O$_3$:

$0.01 \leq Zn/(In+Zn+Y+Sn) \leq 0.25$ $0.50 \leq In/(In+Zn+Y+Sn)$ wherein atomic ratios of the Y element and the Sn element are within the following ranges:

$0.03 \leq Y/(In+Zn+Y+Sn) \leq 0.25$, and $0.03 \leq Sn/(In+Zn+Y+Sn) \leq 0.30$.

10. The oxide sintered body according to claim 9, wherein the oxide sintered body includes a pyrochlore phase represented by $Y_2Sn_2O_7$.

11. The oxide sintered body according to claim 10, wherein any one or more of the Y element and the Zn element form a substitutional solid solution with the bixbyite phase.

12. The oxide sintered body according to claim 9, wherein the proportion of presence of the bixbyite phase represented by $In_2O_3$ in the oxide sintered body is equal to or more than 50 wt %.

13. An oxide sintered body comprising an In element, a Zn element, a Sn element and a Y element, wherein
   atomic ratios of the Zn element and the In element are within ranges below, wherein
   the oxide sintered body consists of a bixbyite phase represented by $In_2O_3$ and a pyrochlore phase represented by $Y_2Sn_2O_7$, or
   the oxide sintered body consists of a bixbyite phase represented by $In_2O_3$, a pyrochlore phase represented by $Y_2Sn_2O_7$ and an indium trizincoindate phase represented by $In((Zn_3In)O_6)$ $0.01 \leq Zn/(In+Zn+Y+Sn) \leq 0.25$ $0.50 \leq In/(In+Zn+Y+Sn)$.

14. The oxide sintered body according to claim 13, wherein any one or more of the Y element and the Zn element form a substitutional solid solution with the bixbyite phase.

15. The oxide sintered body according to claim 13, wherein atomic ratios of the Y element and the Sn element are within the following ranges:

$0.03 \leq Y/(In+Zn+Y+Sn) \leq 0.25$, and $0.03 \leq Sn/(In+Zn+Y+Sn) \leq 0.30$.

* * * * *